United States Patent
Hartensveld

(10) Patent No.: US 12,288,800 B2
(45) Date of Patent: Apr. 29, 2025

(54) MONOLITHIC SEMICONDUCTOR LED DISPLAY SYSTEMS AND METHODS THEREOF

(71) Applicant: Innovation Semiconductor, Rochester, NY (US)

(72) Inventor: Matthew T. Hartensveld, Wyckoff, NJ (US)

(73) Assignee: INNOVATION SEMICONDUCTOR, Rochester, NY (US)

( * ) Notice: Subject to any disclaimer, the term of this patent is extended or adjusted under 35 U.S.C. 154(b) by 718 days.

(21) Appl. No.: 17/527,264

(22) Filed: Nov. 16, 2021

(65) Prior Publication Data

US 2022/0157884 A1   May 19, 2022

Related U.S. Application Data

(60) Provisional application No. 63/114,247, filed on Nov. 16, 2020.

(51) Int. Cl.
| | |
|---|---|
| *H01L 33/00* | (2010.01) |
| *H01L 27/15* | (2006.01) |
| *H01L 33/06* | (2010.01) |
| *H01L 33/32* | (2010.01) |

(52) U.S. Cl.
CPC .......... *H01L 27/156* (2013.01); *H01L 33/007* (2013.01); *H01L 33/06* (2013.01); *H01L 33/32* (2013.01)

(58) Field of Classification Search
None
See application file for complete search history.

(56) References Cited

U.S. PATENT DOCUMENTS

| | | | |
|---|---|---|---|
| 2012/0223875 A1* | 9/2012 | Lau | G09G 3/32 345/82 |
| 2018/0331182 A1 | 11/2018 | Then et al. | |
| 2020/0066786 A1* | 2/2020 | Hartensveld | H01L 33/06 |
| 2020/0266318 A1 | 8/2020 | Lee | |
| 2022/0059726 A1* | 2/2022 | Pinos | H01L 27/156 |
| 2022/0122519 A1* | 4/2022 | Bower | H01L 25/167 |
| 2023/0197883 A1* | 6/2023 | Bharadwaj | H01L 33/06 257/9 |

FOREIGN PATENT DOCUMENTS

WO   2020120692 A1   6/2020

OTHER PUBLICATIONS

International Search Report and Written Opinion of the International Searching Authority, dated Feb. 1, 2022.

* cited by examiner

*Primary Examiner* — Bradley Smith
(74) *Attorney, Agent, or Firm* — TROUTMAN PEPPER LOCKE LLP

(57) ABSTRACT

A monolithic semiconductor LED display system comprising a layered semiconductor material system fabricated to form a plurality of light emitting switch devices. Each of the light emitting switch devices extends along a different axis from a common substrate and comprises a driver device and a light emitting diode. Each of the driver devices comprises, in adjacent order from the substrate and in series, a first type of doped region, a second type of doped region and another of the first type of doped region. Areas of the layered semiconductor material system not utilized for the LED elements are fabricated to form circuitry in two or more of the doped regions for each of the light emitting switch devices.

14 Claims, 9 Drawing Sheets

Fully integrated vertical LED-FET with capacitor and planar n-mos FET

Nanowire LED-Transistor

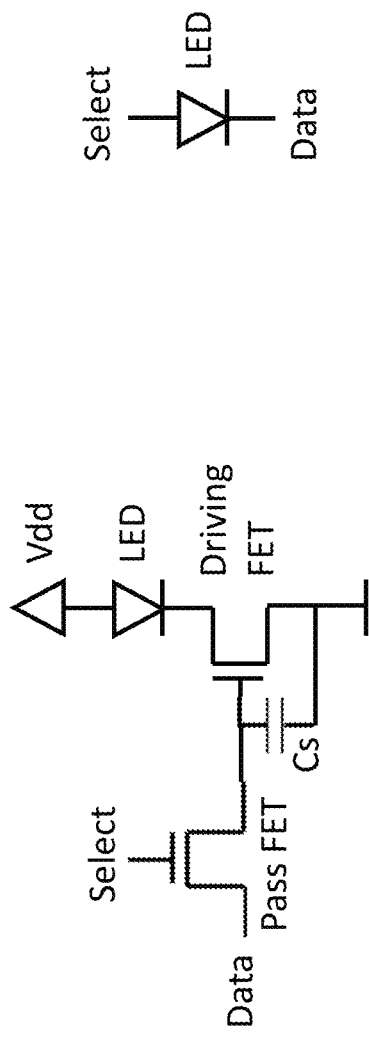
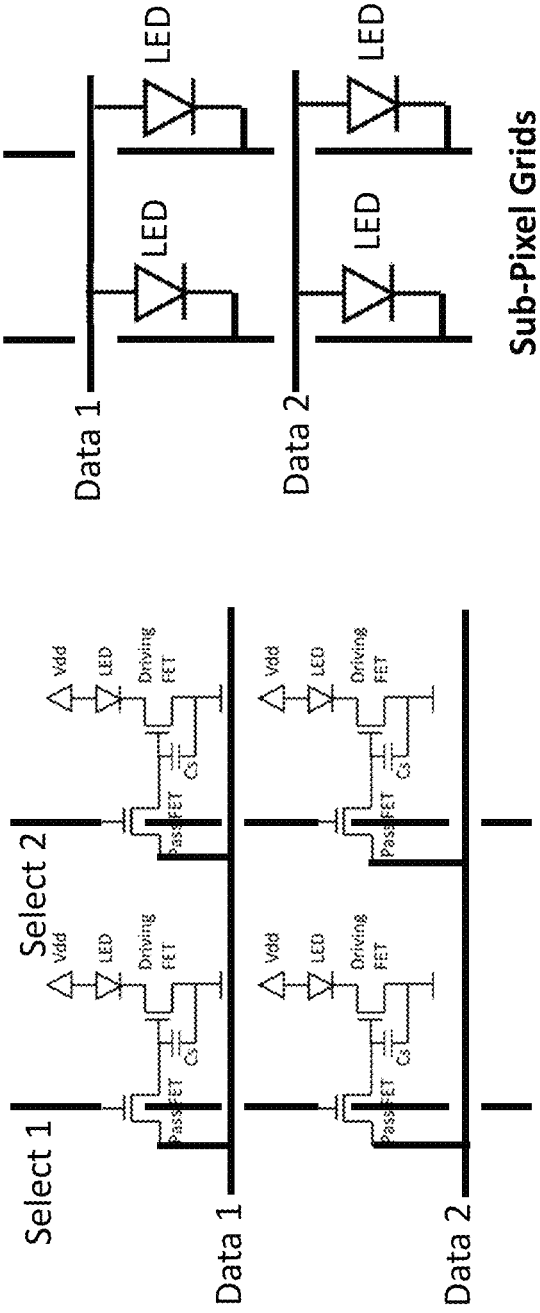
Fig. 1 Active v Passive Matrix – Prior Art

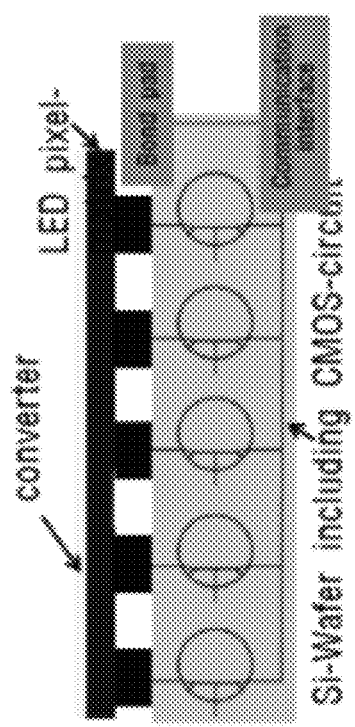
Fig. 2 LEDs integrated with external silicon wafer for added transistor elements – Prior Art

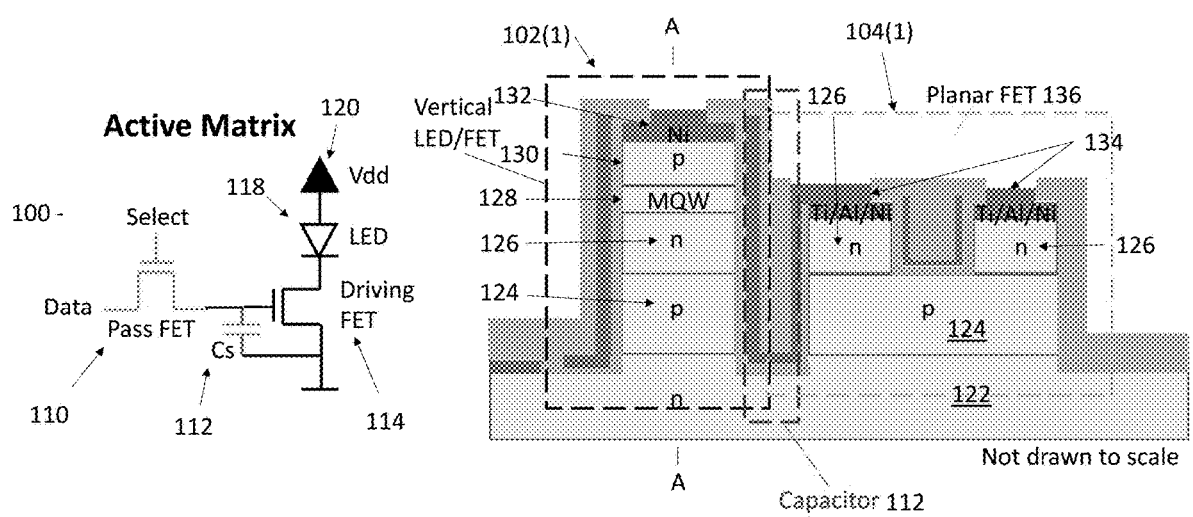
Fig. 3A Fully integrated vertical LED-FET with capacitor and planar n-mos FET

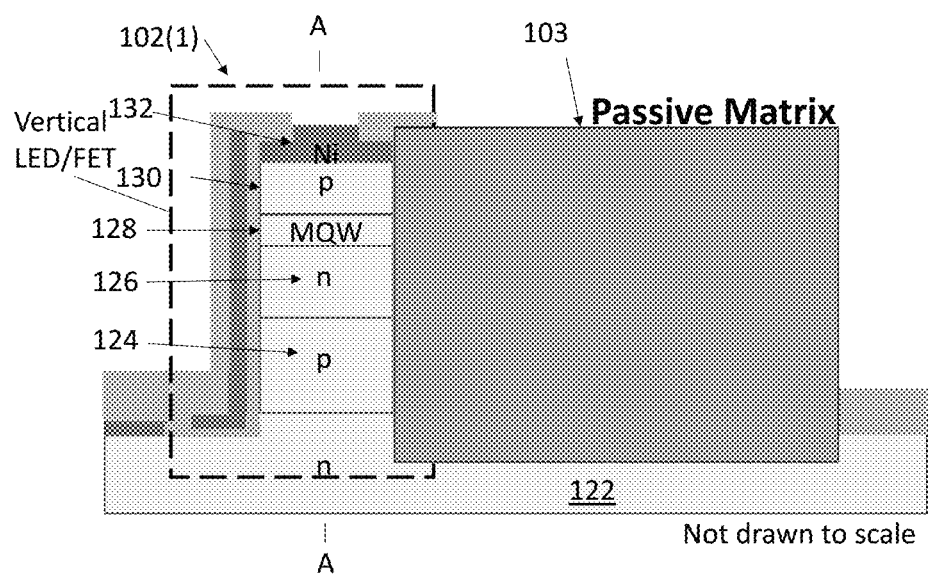
Fig. 3B Fully integrated vertical LED-FET with passive matrix

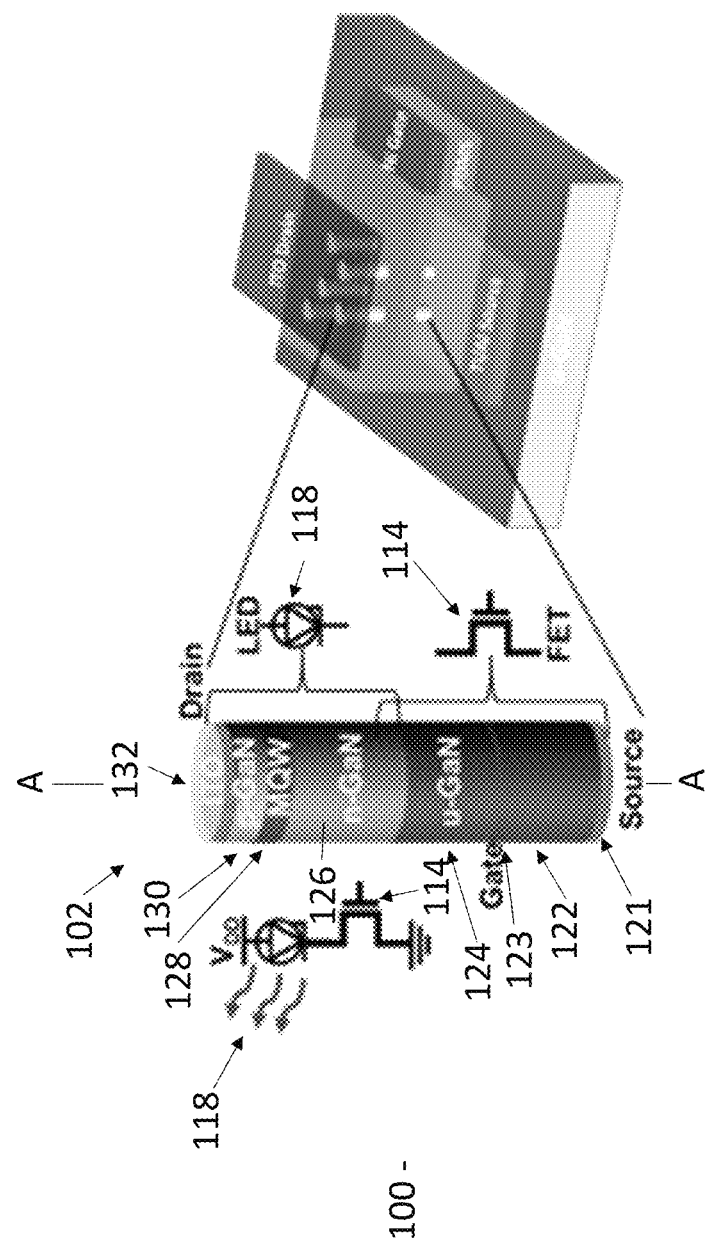
Fig. 4 Nanowire LED-Transistor

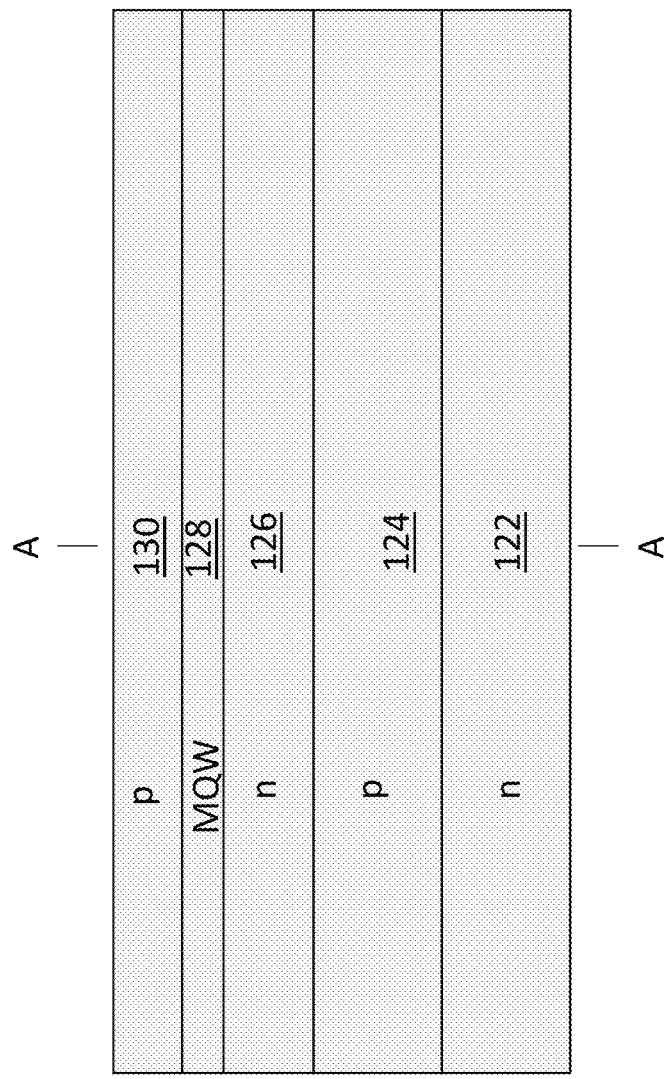
Fig. 5 Grown LED Layer stack on sapphire or silicon substrate

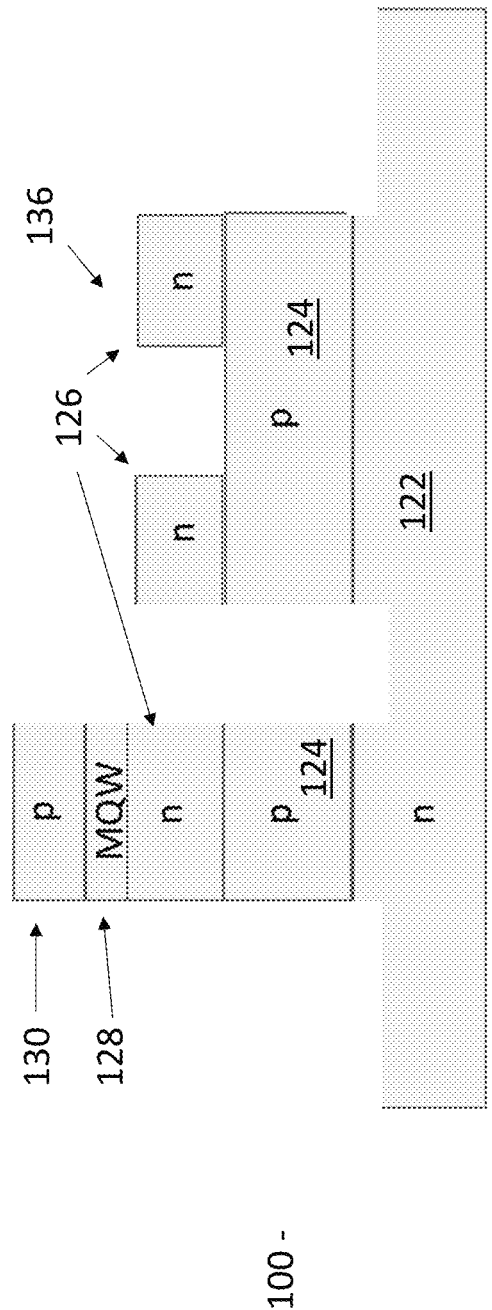
Fig. 6 Selectively etched and masked growth layers

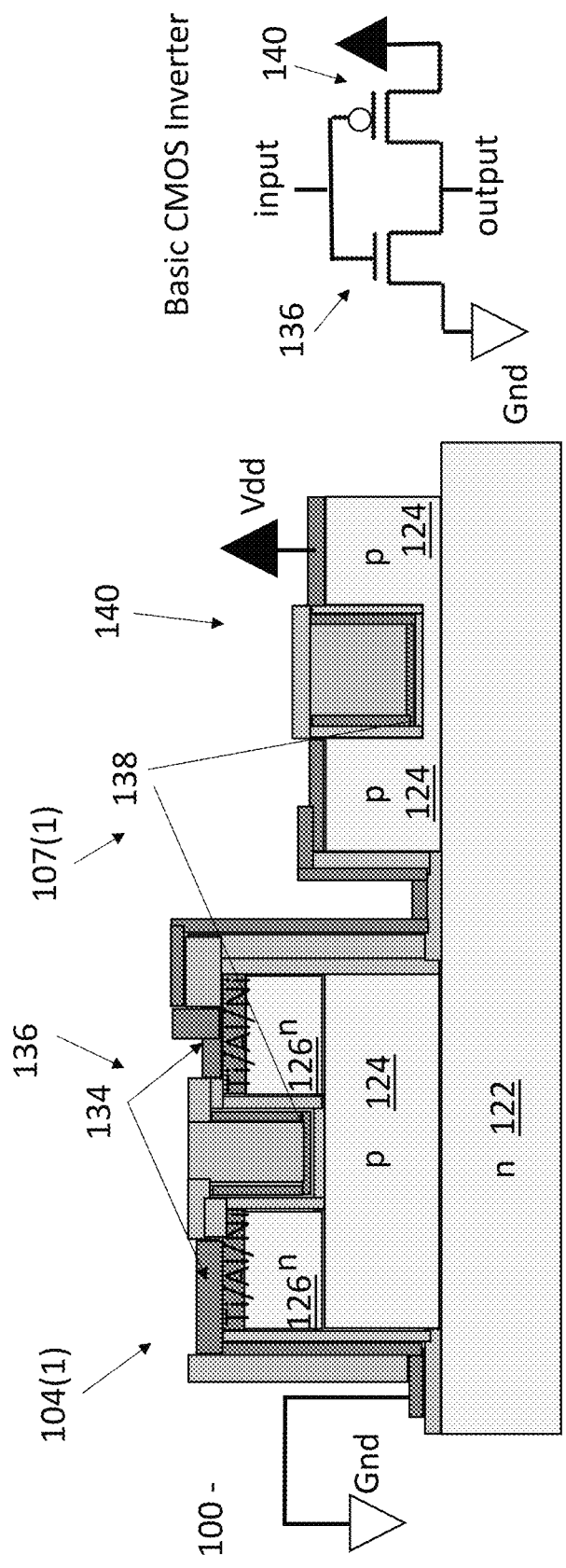
Fig. 7 CMOS inverter composed of n-mos transistor (left) and p-mos transistor (right)

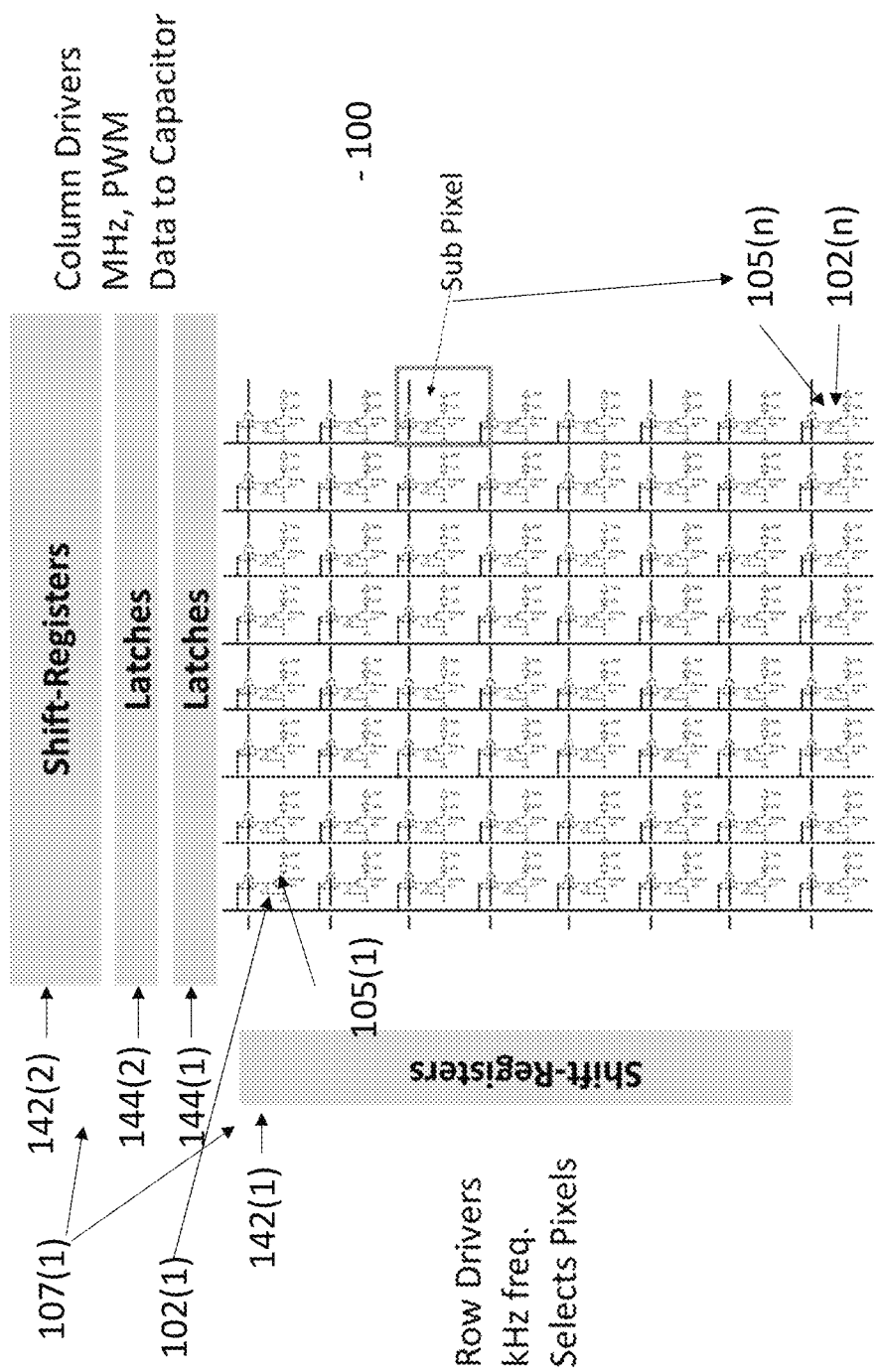
Fig. 8 External driving circuitry for displays

MONOLITHIC SEMICONDUCTOR LED DISPLAY SYSTEMS AND METHODS THEREOF

This application claims benefit of U.S. Provisional Patent Application No. 63/114,247, filed Nov. 16, 2020, the entirety of which is incorporated herein by reference.

FIELD

This technology relates to monolithic semiconductor LED display systems and devices thereof.

BACKGROUND

Generally, there are two types of display technologies comprising passive matrix display technologies and active matrix display technologies as illustrated in FIG. 1. With passive matrix display technologies, the anode and cathode connections for LEDs are tied together in rows and columns, respectively. This passive matrix display technology is the simplest display technology to implement, but it cannot support high resolution due to the additive nature of current leakage for each LED element combined with the inability to hold its charge state. With active matrix display technology, transistors (FETs) and capacitors separate the LED from the row/column lines of the matrix and store the charge state for LED brightness. The foundational element for an active matrix display is the sub-pixel, that includes two transistors (Pass and Driving) and one storage capacitor, in which three sub-pixels make up a pixel.

To date to create a micro-LED, or even an organic LED (OLED) display, the industry has used different material systems and methods to integrate these added transistor and/or capacitor elements to implement the desired active or passive matrix display technology. In particular, the dominant industry approach has been to fabricate transistors on glass or in silicon and then pair the transistors with the LEDs fabricated on a second substrate as illustrated in FIG. 2. Unfortunately, this dominant industry approach is time consuming, costly and is not space efficient, limiting higher resolutions and/or more compact display footprints.

SUMMARY

A monolithic semiconductor LED display system comprising a layered semiconductor material system fabricated to form a plurality of light emitting switch devices. Each of the light emitting switch devices extends along a different axis from a common substrate and comprises a driver device and a light emitting diode. Each of the driver devices comprises, in adjacent order from the substrate and in series, a first type of doped region, a second type of doped region and another of the first type of doped region. Areas of the layered semiconductor material system not utilized for the LED elements are fabricated to form circuitry in two or more of the doped regions for each of the light emitting switch devices.

A method for making a monolithic semiconductor LED display system comprising fabricating a layered semiconductor material system to form a plurality of light emitting switch devices and fabricating in areas of the layered semiconductor material system not utilized for the LED elements circuitry in two or more of the doped regions. Each of the light emitting switch devices extends along a different axis from a common substrate and comprises a driver device and a light emitting diode. Each of the driver devices comprises, in adjacent order from the substrate and in series, a first type of doped region, a second type of doped region and another of the first type of doped region.

Accordingly, examples of this technology provide monolithic LED display systems with higher resolutions, more compact display areas, better performance, and reduced fabrication costs when compared to prior industry designs and approaches. With example of this technology, the monolithic semiconductor LED display system advantageously utilizes the same layers used in forming the one or more light emitting switch devices for the adjacent integrated circuitry.

BRIEF DESCRIPTION OF THE DRAWINGS

FIG. 1 is a prior art diagram of a passive matrix display technology and an active matrix display technology;

FIG. 2 is a prior art diagram of LEDs fabricated on a second substrate;

FIG. 3A is a partial circuit diagram and partial cross-sectional diagram of an example of a portion of a monolithic semiconductor LED display system with a fully integrated LED and FIG. 3B is a partial circuit diagram and partial cross-sectional diagram of another example of a portion of another monolithic semiconductor LED display system with a passive matrix control circuit;

FIG. 4 is a partial circuit diagram, partial perspective diagram and partial exploded diagram of the integrated LED shown in FIG. 3;

FIGS. 5-6 are cross-sectional diagrams of an example of a method for making a monolithic semiconductor LED display system comprising one or more light emitting switch devices and integrated circuitry;

FIG. 7 is a partial cross-sectional diagram of elements of control circuitry for an example of a monolithic semiconductor LED display system; and FIG. 8 is a diagram of control circuitry used to form a serial input to a parallel output to drive the hundreds/thousands of rows and columns of light emitting switch devices in an exemplary monolithic semiconductor LED display system.

DETAILED DESCRIPTION

An example of a portion of a monolithic semiconductor LED display system 100 configured as an active matrix display technology is illustrated in FIG. 3A (An exemplary view of a larger portion of the monolithic semiconductor LED display system 100 is shown in FIG. 8). This exemplary portion of the monolithic semiconductor LED display system 100 includes one of the light emitting switch devices 102(1) and integrated circuitry 104(1), although the monolithic semiconductor LED display system 100 may comprise other types and/or numbers of systems, devices, components, or other elements in other configurations, such as a plurality of light emitting switch devices each with integrated control circuitry by way of example only. This technology provides a number of advantages including providing monolithic LED display systems with higher resolutions, more compact display areas, better performance, and reduced fabrication costs when compared to prior industry designs and approaches. Examples of this technology advantageously utilize the same layers used in forming the one or more light emitting switch devices for the adjacent integrated control circuitry.

In this example, each of the light emitting switch devices 102(1)-102(n) shown in FIGS. 3-8 (also referred to herein as a Vertical LED/FET, although other directional orientations may be used) extends out along an axis from a surface of a substrate, such as a sapphire wafer by way of example only. For ease of illustration and discussion, the one of the light emitting switch devices 102(1) the corresponding one of the integrated circuitry 104(1) will be illustrated and described in greater detail herein. In this example, the other light emitting switch devices 102(2)-102(n) and the other corresponding integrated circuitry 104(2)-104(n) in the monolithic semiconductor LED display system 100 have the same structure and operation as the one of the light emitting switch devices 102(1) and the corresponding one of the integrated circuitry 104(1), although in other examples one or more of the other light emitting switch devices and/or integrated circuitry may comprise other components or other elements in other configurations.

Referring more specifically to FIGS. 3-4, in this example the one of the light emitting switch devices 102(1) comprises a light emitting diode 118 and a driving field effect transistor (FET) 114 or other device driver, although the light emitting switch device could comprise other types and/or numbers of other components and/or other elements in other configurations. Additionally, in this example, the light emitting diode 118 is coupled in series between the voltage source $V_{dd}$ 120 and the driving FET 114 which is also coupled in series to ground to control an operational state of the light emitting diode 118, as illustrated and described, by way of example in U.S. Pat. No. 11,011,571 which is hereby incorporated by reference in its entirety.

The driving FET 114 or other device driver is coupled to control an operational state, i.e. an on state or an off state in this example, of the LED 118, although other types of drivers or switches may be used. Each sub-pixel 105(1)-105(n) includes one of the light emitting switch devices 102(1)-102(n), corresponding ones of the integrated circuitry 104(1)-104(n), and capacitor 112 shown by way of example in the larger portion in FIG. 8, can have brightness modulated with the corresponding one of the driving FET 114 or other device driver.

In this example, the driving FET 114 comprises an n-type GaN layer 122 of the driving FET 114 which is located on a surface of a substrate 121. This layer of the driving FET 114 is an electron rich source region for the FET that is grown or otherwise formed on the substrate 121, although other types of source regions may be used, such as unintentionally doped (u-GaN) or p-GaN.

Next, the driving FET 114 or other device driver has a p-type GaN layer 124 of the FET 114 that is located on the n-type GaN layer 122 described above. This p-type GaN layer 124 is an electron deficient channel region for the FET 114 that is grown or otherwise formed on the n-type GaN layer 122, although other types of channel regions may be used such as u-GaN or n-GaN.

Next, the driving FET 114 or other device driver has an n-type GaN layer 126 of the FET that is formed on the p-type GaN layer 124 described above. This n-type GaN layer 126 is an electron rich drain region for the FET 114 that is grown or otherwise formed on the p-type GaN layer 124, although other types of drain or charge collection regions may be used, such as a p-type GaN layer. As illustrated in FIGS. 3-4, these etched layers of the FET extend along a perpendicular axis A-A from a surface of the substrate.

Next is the LED 118 of the one of the light emitting switch devices 102(1), above the driving FET 114 and extending along the same axis from a surface of the substrate 121. In this example, the n-type GaN layer 126 of a drain or charge collection region of the driving FET 114 is advantageously shared with and acts as an electron rich layer of the LED 118. Further, as discussed earlier the LED 118 and the driving FET 114 are each constructed to extend out from a surface of the substrate along a single axis A-A to enable a much more compact narrow design enabling closer spacing of the light emitting switch devices 102-102(n) so that much higher resolution can be achieved, although other configurations may be used.

Next, the LED 118 has a layer 128 comprising a multiple quantum well (MQW) region with for example InGaN or AlGaN quantum wells and GaN or AlGaN barriers for the LED that efficiently generate light, although other types of layers and/or wells and other barriers may be used. More specifically, in this example light emission from the LED 118 makes use of this layer 128 comprising the MQW region, where layers of Indium Gallium Nitride (InGaN) or Aluminum Gallium Nitride (AlGaN) are confined between layers of GaN or AlGaN in order to trap electron-hole pairs for the generation of light. In other examples, one or more other layers of material that alter a spectral emission may be used. By way of a further example, one or more of the additional layers may comprise a color converter.

Next the LED 118 has a p-GaN layer 130 formed on the layer 128 with the MQW region, although again other types of layers may be used. This p-GaN layer 130 with the layer 128 comprising the multiple quantum well (MQW) region and the shared n-GaN layer 126 complete this example of the LED 118 for the one of the light emitting switch devices 102(1), although the LED may have other types and/or numbers of other layers and/or elements. Accordingly, in this example, the LED 118 and the driving FET 114 are connected in series with a shared layer 126 and with the driving FET 114 being able to switch the LED 118 between "on" or "off" operational states and this light emitting switch device 102 may be repeated with a plurality of other light emitting switch devices 102(1)-102(n) other through monolithic semiconductor LED display system 100.

Meanwhile, with this design of the exemplary light emitting switch device 102(1) extending along an axis A-A from a surface of the substrate 121, circuitry 104(1) may also advantageously be formed adjacent to exemplary light emitting switch device 102(1), similarly for light emitting switch devices 102(2)-102(n) and corresponding ones of circuitry 104(2)-104(n), and utilize some of the same layers described above being used for the driving FET 114 and LED 118 of the one of the light emitting switch devices 102(1). For ease of illustration and discussion, the circuitry 104(1) for the one of the light emitting switch devices 102(1) will be illustrated and described in greater detail herein.

In this example, the circuitry 104(1) for the one of the light emitting switch devices 102(1) implements an active matrix display technology, although other types of circuitry, such as for passive matrix display technology may be used as shown in FIG. 3B. Additionally, in this example, the circuitry 104(1)-104(n) for the other light emitting switch devices 102(1)-102(n) in the monolithic semiconductor LED display system 100 have the same elements, configuration, and operation as the circuitry 104(1) for the one of the light emitting switch devices 102(1), although in other examples one or more of the circuitry 104(1)-104(n) for corresponding ones of the light switch emitting devices 102(1)-102(n) may comprise other components or other elements in other configurations. The etched space between the exemplary light emitting switch device 102(1) and the planar FET 110 may be optionally be filled with a dielectric and metal to form the capacitor 112. Additionally, in different examples illustrated and described herein, 'planar FET' may comprise planar FET 110 which is relates to planar FETs that are used in the active matrix circuitry 104(1), in other examples 'planar FET' can also refer to planar FETs outside of the display used to make the control circuitry, such as shown in FIG. 7, wherein in the illustrated example the NMOS FET is referred to as planar FET 136 and the PMOS FET is referred to as planar FET 140.

Accordingly as shown in the example in FIGS. 3 and 6, the circuitry 104(1) comprises a planar FET 110 with a source, gate, and a drain, coupled to the gate of the driving FET 114 along with a capacitor 112 coupled between a gate and a source of the driving FET 114, although the circuitry may comprise other types and/or number of components or other elements in other configurations.

As illustrated in this example above, the n-GaN Layer 126 shared by the FET 114 and LED 118 may be etched to be adjacent to, but spaced apart from the one of the light emitting switch devices 102(1) to form the source and drain of the planar FET 110. As shown in FIG. 7, the n-GaN Layer 126 shared by the FET 114 and LED 118 may also be etched to be spaced apart from the active matrix circuit 104(1) to form the source and drain of the planar FET 136 as a part of additional control circuitry 107(1) as shown in FIG. 8 coupled to the one of the light emitting switch devices 102(1) and the corresponding one of the circuitry 104(1). Similar additional control circuitry can be coupled to each of the other ones of the light emitting switch devices 102(2)-102(n) and corresponding ones of the circuitry 104(1)-104(n). Also, in this example, the p-type GaN layer 124 which forms the electron deficient channel region for the driving FET 114 or other devices may be etched to be adjacent to, but spaced apart from the one of the light emitting switch devices 102(1) to form the channel region of the planar FET 110. Similarly, the p-type layer 124 may be etched to be adjacent to, but spaced apart from the circuit 104(1), which in this example is an active matrix circuit, to form the channel region of planar FET 136 or source and drain of the planar FET 140 for part of the control circuitry 107(1).

Conductive contacts 132 and 134 may be coupled as needed to the exemplary light emitting switch device 102(1), the planar FET 136, and planar FET 140 for both operation and routing. In this example, the conductive contact 132 may be formed on the p-type GaN layer 130 of the LED 118 and on the p-type layer 124 of the planar FET 140, although other types of configurations for the contacts could be used. The conductive contacts 134 may be formed on the n-type GaN 126 of the planar FET 136, the n-type GaN 126 of the planar FET 136, and the n-type GaN 122 of monolithic semiconductor LED display system 100, for both operation and routing. Subsequent formation of a gate capacitor may be done in the regions between both contacts for the planar FET 136, and planar FET 140. Accordingly, the deposition and etchings of the respective layers 122, 124, 126, 128, and/or 130 in this monolithic semiconductor LED display system 100 result in the exemplary circuitry for integrated circuits 104(1)-104(n) and also control circuits, such as the exemplary control circuit 107(1), and the one of the light emitting switch devices 102(1)-102(n) to form an effective and compact monolithic semiconductor LED display system 100.

As a result, with the examples of the technology the exemplary light emitting switch device 102(1) and the planar FET 110 and capacitor 112 for the active matrix circuitry 104(1) as well as the control circuitry 107(1) (although other types of circuits could be formed in these layers) may be advantageously formed from the same material, e.g. GaN based material, in a monolithic display system structure 100, FIG. 8, which reduces the number of materials required for manufacturing providing resulting efficiencies. Additionally, this design eliminates prior errors which may result from separately manufacturing and then trying to pair, for example, the active-matrix circuitry 104(1) and/or control circuit 107(1) to the LED 118. Further, this example enables the monolithic semiconductor LED display system 100, FIG. 8, to have a high density and resulting high resolution with the multiple light emitting switch devices 102(1) along with the space efficient integration of the control circuitry for each in the monolithic semiconductor LED display system 100.

Referring to FIGS. 5-6, an example of a method for making an example of this portion of the active matrix LED display system 100 comprising the one of the light emitting switch devices 102(1) and the corresponding integrated circuitry 104(1) is illustrated. In this example, the other light emitting switch devices 102(1) and the corresponding integrated active-matrix circuitry 104(1) for each can be made in the same manner, although in other examples one or more other manufacturing approaches may be used.

Initially, an un-etched stack for a portion of an active matrix semiconductor LED display system 100 is illustrated in FIG. 5. Prior to etching, the stack in this example comprises: an n-type GaN layer 122 on a surface of a substrate (not shown in FIG. 5); a p-type GaN layer 124; the shared n-type GaN layer 126; the layer with the MQW region 128, and the p-type GaN layer 130, although the stack could comprise other types and/or numbers of other layers and/or conductive contacts shown in other examples herein.

As shown in this example in FIG. 6, the layers 122, 124, 126, 128, and 130 of this stack for a portion of an active-matrix semiconductor LED display system 100 may be etched to form the exemplary light emitting switch device 102(1) that extends along an axis from a surface of the substrate and to form the adjacent and spaced apart circuitry 104(1) additionally comprising the capacitor 112 and planar FET 110 as described in greater detail with reference to FIGS. 3-4.

Referring to FIG. 7, separate from the active-matrix elements 104(1), additional control circuitry 107(1) can also be created in these same layers for control of the light emitting switch device 102(1) and similarly throughout exemplary system 100 for the other light emitting switch devices 102(2)-102(n). Additional planar FETs 136 and 140 may be selectively etched into the same exemplary initial stack of layers 122, 124, 126, 128, and 130 shown in FIG. 5 is illustrated. In particular, the same layers utilized by the planar FET 110 and light emitting switch device 102 for the active matrix circuitry 100 shown in FIG. 3A may by further selectively etched to pattern the adjacent p-type layer 124 with the n-type layer 122 to create a planar FET 140, as shown on the right side of FIG. 7. In this example in FIG. 7, the N-MOS 136 transistor and P-MOS transistor 140 are coupled in series (as schematically shown on the right side of FIG. 7) to form, by way of example, a CMOS inverter for an element of the control circuitry 107(1), although other types of control circuitry can be advantageously etched in these layers.

Referring to FIG. 8, an example of display control circuitry 107(1), as well as other control circuitry for the other light emitting switch devices, that is used to take a serial input and create a parallel output to drive the hundreds/thousands of rows and columns of the active matrix circuits 104(1)-104(n) for light emitting switch devices 102(1)-102(n). In this example, the additional control circuitry, illustrated by with one example with control circuit 107(1) in FIG. 7, comprises shift-registers circuits 142(1) and 142(2)

and latches 144(1) and 144(2) that are used to manage the signals to send to the active matrix circuits 104(1)-104(n) which form each sub-pixel 105(1)-105(n). In this example, with this technology each sub-pixel 105(1)-105(n) as outlined would have circuitry comprising one of the active matrix control circuit 104(1)-104(n), illustrated and described earlier with reference to FIGS. 3-6 by way of example only, that is integrated within the layers 122, 124, 126, 128, and 130 as described earlier. Conventionally, each element of these circuits 104(1)-104(n) as well as each of the control circuits, illustrated by the exemplary control circuitry 107(1), for each, would have been a separate material system and either connected with ribbon cables to a PCB or through bonding a silicon chip to the display itself which becomes incredible cumbersome with high resolution displays using thousands of external contacts. However, with this exemplary technology in which the planar transistors comprise both elements of for example with respect to light emitting switch device 102(1) the active matrix circuit 104(1) and control circuitry 107(1), which are advantageously integrated within the same layers 122, 124, 126, 128, and 130 used to form each of the light emitting switch devices 102(1)-102(n), such as light emitting switch device 102(1), the number of external off-chip connections is dramatically cut down.

Accordingly, as illustrated and described by way of the examples herein, this technology provides monolithic LED display systems 100 with higher resolutions, more compact display areas, better performance, and reduced fabrication costs when compared to prior industry designs and approaches. Additionally, with example of this technology, the monolithic semiconductor LED display system 100 advantageously utilizes the same layers used in forming the one or more light emitting switch devices 102(1) for the adjacent integrated control circuitry 104(1) and 107(1).

Having thus described the basic concept of the technology, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the technology. Additionally, the recited order of processing elements or sequences, or the use of numbers, letters, or other designations therefore, is not intended to limit the claimed processes to any order except as may be specified in the claims. Accordingly, the technology is limited only by the following claims and equivalents thereto.

What is claimed is:

1. A monolithic semiconductor light emitting diode display system comprising:
a layered semiconductor material system fabricated to form a plurality of light emitting switch devices, each of the light emitting switch devices extending along a different axis from a common substrate and comprising a driver device and a light emitting diode, wherein each of the driver devices comprises, in adjacent order from the substrate and in series, a first type of doped region, a second type of doped region and another of the first type of doped region; and
areas of the layered semiconductor material system not utilized to form and adjacent to the light emitting switch devices are fabricated to form circuitry in two or more of the doped regions for the light emitting switch devices.

2. The system as set forth in claim 1 wherein the layered semiconductor material system is a layered GaN material system.

3. The system as set forth in claim 1 wherein the circuitry in the two or more of the doped regions further comprises an active matrix circuit.

4. The system as set forth in claim 3 wherein the active matrix circuitry further comprises:
at least one field effect transistor formed in the two or more of the doped regions; and
a capacitor formed between the light emitting switch device and the at least one field effect transistor.

5. The system as set forth in claim 1 wherein the circuitry in the two or more of the doped regions further comprises a CMOS circuit.

6. The system as set forth in claim 5 wherein the CMOS circuit further comprises:
one or more P-MOS transistors in selected portions of the first type of doped region and the second type of doped region; and
one or more N-MOS transistors in other selected portions of the P-type region and adjacent second N-type region.

7. The system as set forth in claim 1 wherein the circuitry in the two or more of the doped regions further comprises a passive matrix control circuit.

8. A method for making a monolithic semiconductor light emitting diode display system, the method comprising:
fabricating a layered semiconductor material system to form a plurality of light emitting switch devices, each of the light emitting switch devices extending along a different axis from a common substrate and comprising a driver device and a light emitting diode, wherein each of the driver devices comprises, in adjacent order from the substrate and in series, a first type of doped region, a second type of doped region and another of the first type of doped region; and
fabricating in areas of the layered semiconductor material system not utilized for and adjacent to the LED elements circuitry in two or more of the doped regions for the light emitting switch devices.

9. The method as set forth in claim 8 wherein the layered semiconductor material system is a layered GaN material system.

10. The method as set forth in claim 8 wherein the circuitry in the two or more of the doped regions further comprises an active matrix control circuit.

11. The method as set forth in claim 10 wherein the active matrix circuitry further comprises:
at least one field effect transistor formed in the two or more of the doped regions; and
a capacitor formed between the light emitting switch device and at least one field effect transistor.

12. The method as set forth in claim 8 wherein the circuitry in the two or more of the doped regions further comprises a CMOS circuit.

13. The method as set forth in claim 12 wherein the CMOS circuit further comprises:
one or more P-MOS transistors in selected portions of the first type of doped region and the second type of doped region; and
one or more N-MOS transistors in other selected portions of the P-type region and adjacent second N-type region.

14. The method as set forth in claim 8 wherein the circuitry in the two or more of the doped regions further comprises a passive matrix control circuit.

* * * * *